United States Patent [19]
Stockman et al.

[11] Patent Number: 6,133,783
[45] Date of Patent: Oct. 17, 2000

[54] PHASE JITTER CANCELLER

[75] Inventors: John Stockman, Corona Del Mar; Mikko Oijala, Irvine, both of Calif.

[73] Assignee: Samsung Electronics Co., Inc., Seoul, Rep. of Korea

[21] Appl. No.: 08/889,717

[22] Filed: Jul. 7, 1997

[51] Int. Cl.[7] ................................... H03B 1/00
[52] U.S. Cl. .................. 327/554; 327/555; 375/233; 375/235; 375/371
[58] Field of Search ................... 327/551–559, 327/149, 158, 161; 375/233, 235, 371, 346, 226

[56] References Cited

U.S. PATENT DOCUMENTS

| | | | |
|---|---|---|---|
| 5,304,957 | 4/1994 | Edwards | 331/12 |
| 5,315,618 | 5/1994 | Yoshida | 375/94 |
| 5,434,884 | 7/1995 | Rushing et al. | 375/235 |
| 5,579,351 | 11/1996 | Kim | 375/371 |

*Primary Examiner*—Timothy P. Callahan
*Assistant Examiner*—Minh Nguyen
*Attorney, Agent, or Firm*—Townsend and Townsend and Crew LLP

[57] ABSTRACT

A system and method for use in cancelling phase jitter in a Phase Locked Loop (PLL) circuit. A phase jitter canceller receives a phase error signal having phase jitter centered around a center frequency. A frequency and phase control circuit determines the phase of a particular component of phase jitter and an amplitude control circuit determines the amplitude of the particular component of phase jitter in the signal. The output of the phase jitter canceller provides an estimate of the particular component of phase jitter. A parallel arrangement of phase jitter cancellers is also provided for use in cancelling several components of phase jitter.

7 Claims, 4 Drawing Sheets

PHASE JITTER CANCELLER

BACKGROUND OF THE INVENTION

The present invention relates generally to phase locked loop (PLL) circuits used in various communication receivers, and more specifically to a method and apparatus for cancelling phase jitter in a PLL circuit.

A phase locked loop (PLL) is a circuit that allows a particular system to track with another one. More to the point, a PLL is a circuit that synchronizes an output signal (generated by an oscillator) with an input, or reference, signal in frequency and phase. Ideally, when the PLL is operating in the synchronized, or 'locked', state the difference in phase between the oscillator's output signal and the reference signal is zero. In other words, the phase of the output signal is 'locked' to the phase of the reference signal.

FIG. 1 is a block diagram of a conventional PLL circuit 200. The PLL circuit 200 includes a phase detector 210, a low pass filter 220, and a voltage controlled oscillator (VCO) 230. The phase detector is a device that compares the frequency and phase of two input signals, a reference signal/frequency ($f_{in}$) and the output signal/frequency of the VCO ($f_{vco}$), and generates an output that is the measure of their phase difference ($f_{in}$–$f_{vco}$). The output of the phase detector is filtered, amplified and input to the VCO. If $f_{vco}$ is not equal to $f_{in}$ the phase error signal causes the VCO output frequency to deviate in the direction of $f_{in}$. If conditions are just right, the VCO will lock in to $f_{in}$, and a fixed phase relationship with the input reference signal will be established.

In communication systems, PLLs are used extensively for applications including tone decoding, demodulation of AM and FM signals, and regeneration of clean signals. One important capability of the PLL is its ability to suppress noise superimposed on its input signal. The phase detector will try to measure the phase error between the input and output signals, but the phase jitter at the input will cause the zero crossings of a sinusoidal input signal to be advanced or delayed. This causes the phase detector output signal to jitter around an average value. Such phase jitter, if large enough, could potentially 'unlock' the system or introduce errors in a communications system by moving received data points across decision boundaries. It is therefore desirable to filter out or cancel any phase jitter in the PLL system. Phase jitter is a common impairment encountered in real world communications systems, and particularly in systems communicating over voice telephone lines. Of particular importance is the impairment of communication capabilities due to phase jitter in modems operating over voice telephone lines with a large number of points in their constellations, such as a V.17 modem. Phase jitter is typically generated by noise in networks and by poor power supplies.

Most previous methods have utilized an LMS-based adaptive filter approach wherein a filter, such as a finite impulse response filter (FIR), is forced into a configuration that cancels the phase jitter. This approach, however, is a complex approach requiring significant computational resources as well as significant amounts of memory.

As is evident from the above, there is need in the art for a simple, cost-effective method for cancelling phase jitter, with low memory and computational resource requirements.

SUMMARY OF THE INVENTION

The present invention provides a system and method for cancelling phase jitter in a PLL circuit. The phase jitter canceller provides a frequency and phase control circuit for mimicking the frequency and phase of a phase error signal, and an amplitude control circuit for mimicking the amplitude of the phase error signal. The canceller provides an output which is an estimate of the phase jitter that is being cancelled.

According to one aspect of the invention a circuit assembly is provided for use in cancelling phase jitter centered around a particular frequency in a phase error signal, the phase error signal being approximately periodic and having a first amplitude and phase value. The circuit assembly includes means for receiving the phase error signal. The circuit assembly also includes a first frequency and phase control circuit having a first and a second output, including: i) means coupled to the receiving means and to the first output for dynamically mixing the received phase error signal with a first output signal, if any, to produce a first input signal; and ii) means for processing the first input signal to produce the first output signal at the first output and a second output signal at the second output, wherein the first and second output signals are periodic functions having a second phase value, and wherein the second output signal is 90 degrees out of phase with respect to the first output signal; and a second amplitude control circuit having a third output, including: i) means coupled to the receiving means and to the second output for dynamically mixing the received phase error signal with the second output signal, if any, to produce a second input signal having a second amplitude proportional to the first amplitude; and ii) means for processing the second input signal to produce a third output signal at the third output, wherein the third output signal is a function of the second phase value.

According to another aspect of the invention a circuit assembly is provided for use in cancelling phase jitter centered around a particular frequency in a phase error signal, the phase error signal being approximately periodic and having a first amplitude (A) and phase value (b). The assembly comprises: a) an input terminal for receiving the phase error signal, wherein the received phase error signal is approximated by $A*\cos(b)$; b) a first frequency and phase control circuit having a first and a second output terminal, including: i) means coupled to the input terminal and to the first output terminal for mixing the received phase error signal with a first output signal, if any, to produce a first input signal; and ii) means for processing the first input signal to produce the first output signal at the first output terminal and a second output signal at the second output terminal, wherein the first and second output signals are periodic functions having a second phase value (a), and wherein the first output signal is approximated by $\sin(a)$ and the second output signal is approximated by $\cos(a)$; and c) a second amplitude control circuit having a third output terminal, including: i) means coupled to the input terminal, and to the second output terminal for mixing the received phase error signal with the second output signal, if any, to produce a second input signal having a second amplitude proportional to the first amplitude; ii) means for processing the second input signal to produce an intermediate signal having the first amplitude (A); and iii) means for mixing the intermediate signal with the second output signal to produce a third output signal at the third output, wherein the third output signal is approximated by $A*\cos(a)$.

According to yet another aspect of the invention a parallel arrangement of circuit assemblies is provided for use in cancelling phase jitter in a phase error signal having phase jitter components centered around a first frequency and a second frequency, comprising: a first circuit assembly capable of cancelling phase jitter centered around the first frequency, said first circuit assembly receiving the phase error signal at a first input port, wherein said first circuit processes the phase error signal so as to produce, at a first output terminal, a first output signal, such that said first output signal is approximately equal to the first phase jitter component; a second circuit assembly capable of cancelling phase jitter centered around the second frequency, said second circuit assembly receiving the phase error signal at a second input port, wherein said second circuit processes the phase error signal so as to produce, at a second output terminal, a second output signal, such that said second output signal is approximately equal to the second phase jitter component; and means, coupled to said first and second output terminals, for combining said first and second output signals so as to produce, at a third output terminal, a third output signal, such that said third output signal is approximately equal to a combination of the first and second phase jitter components.

Reference to the remaining portions of the specification and the drawings may realize a further understanding of the nature and advantages of the present invention.

DESCRIPTION OF THE PREFERRED EMBODIMENT

Figure 1:
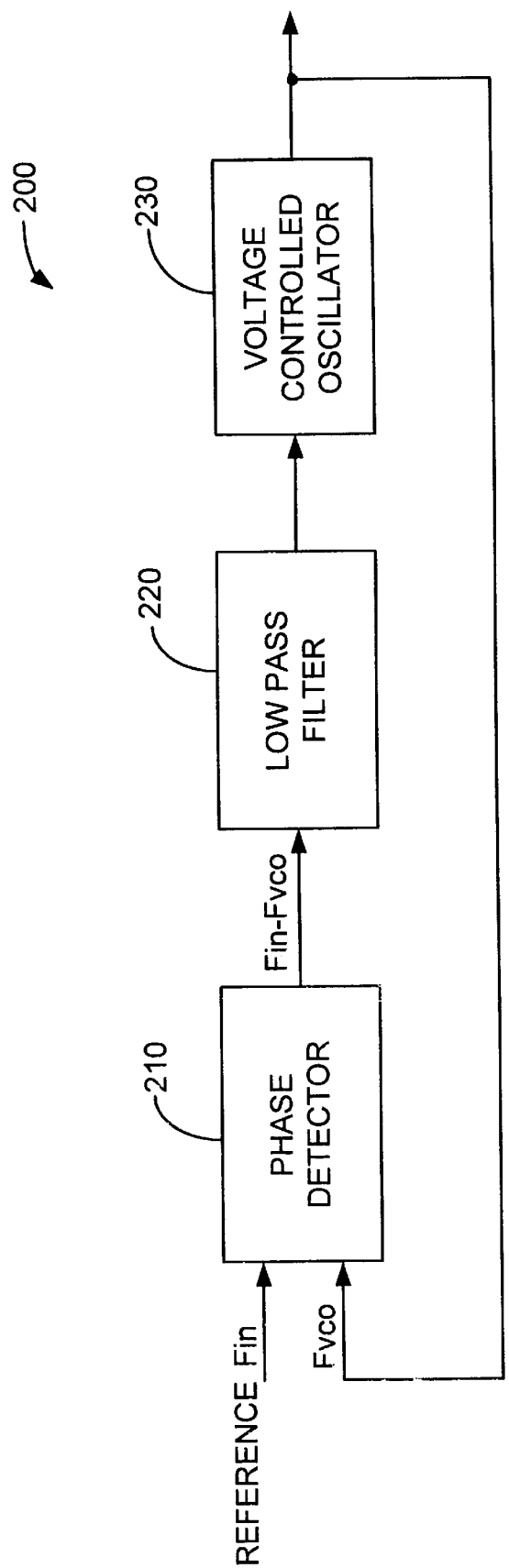
FIG. 1 is a block diagram of a conventional PLL circuit for which the present invention is useful.
Figure 2:
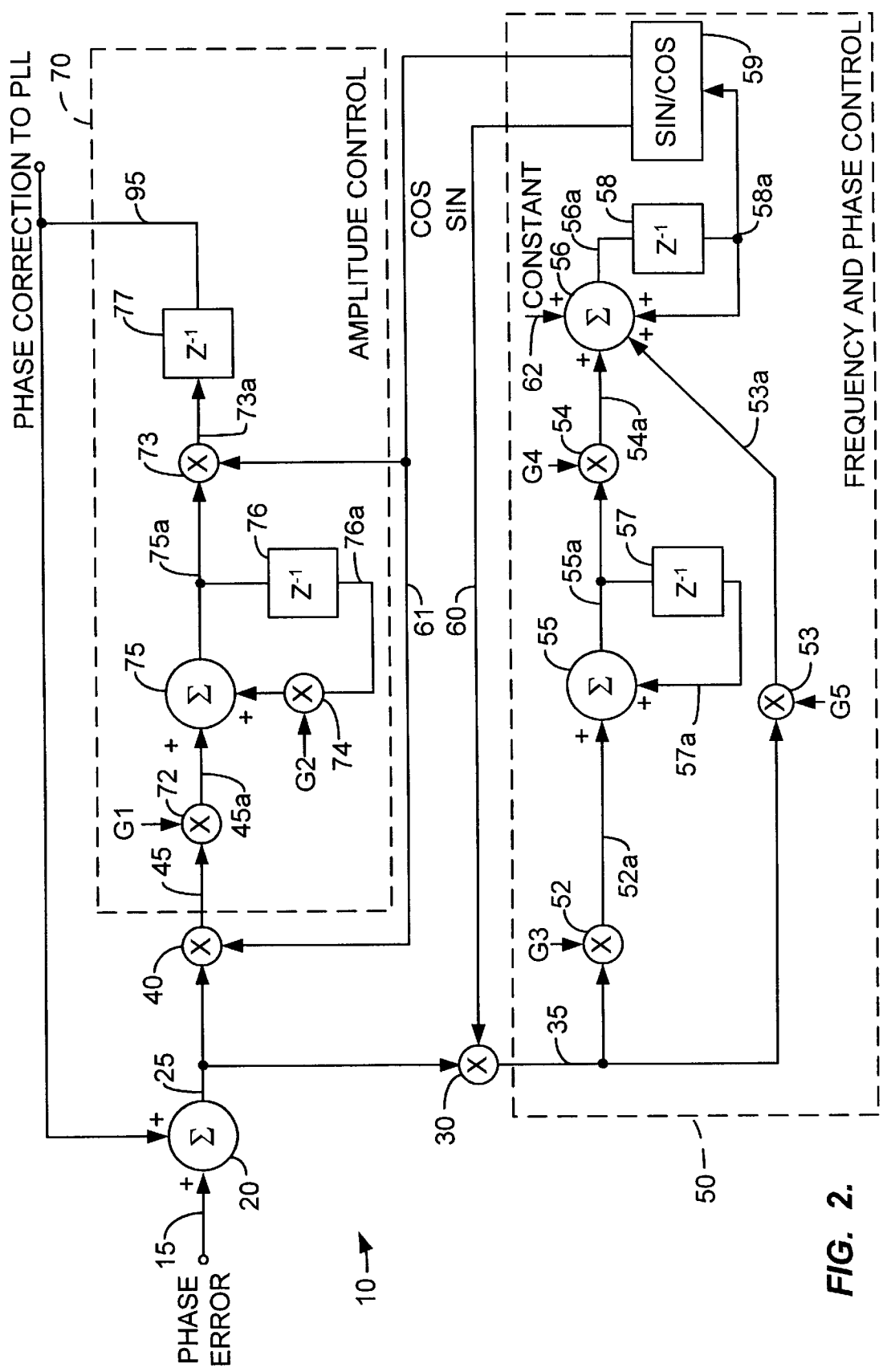
FIG. 2 is a schematic block diagram of a phase jitter canceller according to the present invention.

FIG. 2 is a schematic block diagram of a phase jitter canceller 10 according to the present invention. Phase jitter canceller 10 is capable of cancelling phase jitter centered around a single frequency. A typical application, for example, is the cancellation of 30, 60 or 120 Hz components of phase jitter. More than one phase jitter canceller can be connected in parallel where the phase jitter consists of more than one frequency or component.

Phase jitter canceller 10, in the preferred embodiment, includes main input line 15, input adder 20, first input mixer 30, second input mixer 40, frequency and phase control circuit 50, and amplitude control circuit 70. Main input line 15 is coupled to a first input of input adder 20, the output of which is coupled in parallel to a first input of first input mixer 30 and a first input of second input mixer 40 over first input line 25. The output of first input mixer 30 comprises the input to frequency and phase control circuit 50 over second input line 35. Similarly, the output of second input mixer 40 comprises the input to amplitude control circuit 70 over third input line 45.

Frequency and phase control circuit 50, in the preferred embodiment, includes first phase control (PC) mixer 52, second PC mixer 53, third PC mixer 54, first PC adder 55, second PC adder 56, first PC delay circuit 57, second PC delay circuit 58 and sin/cos generator 59. As shown in FIG. 2, second input line 35 is coupled in parallel to the inputs of first PC mixer 52 and second PC mixer 53. The output of first PC mixer 52 is coupled to a first input of first PC adder 55. Similarly, the output of second PC mixer 53 is coupled to a first input to second PC adder 56. The output of first PC adder 55 is coupled in parallel to the inputs of third PC mixer 54 and first PC delay 57, the output of which is coupled to a second input of first PC adder 55. The output of third PC mixer 54 is coupled to a second input of second PC adder 56, the output of which comprises the input of second PC delay 58. The output of second PC delay 58 is coupled in parallel to a third input to second PC adder 56 and to the input of sin/cos generator 59. Second PC adder 56, in the preferred embodiment, includes four inputs as shown. The fourth input 60 provides input of a user adjustable signal. First output 60 of sin/cos generator 59 is coupled to a second input of first input mixer 30. Similarly, second output 61 is coupled to a second input of second input mixer 40.

Amplitude control circuit 70, in the preferred embodiment, includes first amplitude control (AC) mixer 72, second AC mixer 73, third AC mixer 74, AC adder 75, first AC delay circuit 76 and second AC delay circuit 77. As shown in FIG. 2, third input line 45 is coupled to an input of first AC mixer 72, the output of which is coupled to a first input of AC adder 75. The output of AC adder 75 is coupled in parallel to a first input of second AC mixer 73 and the input to first AC delay 76. The output of first AC delay is coupled in series to third AC mixer 74 and to a second input of AC adder 75 as shown. In the preferred embodiment, AC adder 75 includes two inputs as shown. Second output 61 of phase control circuit 50 is also coupled to a second input of second AC mixer 73, the output of which is coupled to the input of second AC delay 77. The output line 95 of second AC delay 77 is coupled to a second input of input adder 20. Output line 95 comprises the output of canceller 10.

In operation, input adder 20 receives a signal on main input line 15 and adds it to the output of canceller 10 received over output line 95 to produce a first input signal on first input line 25. First input mixer 30 mixes the first input signal received over first input line 25 with a first output signal received over first output line 60 to produce a second input signal on second input line 35. Similarly, second input mixer 40 mixes the first input signal received over first input line 25 with a second output signal received over second output line 61 to produce a third input signal on third input line 45.

First PC mixer 52 amplifies the second input signal received over second input line 35 by mixing it with a signal having a set value (G3) to produce an amplified second input signal on first mixer line 52a. Similarly, second PC mixer 53 amplifies the second input signal received over line 35 by mixing it with a signal having a set value (G5) to produce an amplified second input signal on second mixer line 53a. First PC adder 55 adds the signals received at its inputs to produce a first integrator output signal on first integrator line 55a. The signal received by first PC adder 55 over delay line 57a is a delayed version of the first integrator output signal processed by delay circuit 57. First PC adder 55, first integrator line 55a, delay circuit 57 and delay line 57a together form an integrator, for example. Third PC mixer 54 amplifies the first integrator output signal received over first integrator line 55a by mixing it with a signal having a set value (G4) to produce an amplified integrator signal on third mixer line 54a. Second PC adder 56 adds all signals received at its inputs to produce a second integrator output signal on second integrator line 56a. A signal having an adjustable constant value is provided to the fourth input 62 of second PC adder 56. Second delay circuit 58 produces a delayed version of the second integrator output signal on delay line 58a. Sin/cos generator 59 receives the delayed second integrator output signal over delay line 58a and produces first and second output signals on first output line 60 and second output line 61, respectively.

First AC mixer 72 amplifies the third input signal received over line 45 by mixing it with a signal having a set value (G1) to produce an amplified third input signal on first mixer line 45a. AC adder 75 adds the signals received at its inputs to produce an integrator output signal on integrator line 75a. First AC delay 76 processes the integrator output signal received over integrator line 75a to produce a delayed signal on first delay line 76a. Third AC mixer 74 amplifies the delayed signal by mixing it with a signal having a set value (G2) to produce an amplified (and delayed) version of integrator output signal, which is received at the second input to AC added 75. Second AC mixer 73 mixes the integrator output signal received over line 75a with the second output signal received from phase circuit 50 over second output line 61 to produce a second AC mixer output signal on second delay line 73a. Second AC delay 77 introduces a delay to the second AC mixer output signal of second delay line 73a to produce a second delay output signal on output line 95. Output line 95 is the output of canceller 10.

In operation, a phase error signal is received by input adder 20 via main input line 15 and added to the output signal of canceller 10 received over output line 95 to produce the first input signal on first input line 25. First input mixer 30 mixes the first input signal with the first output signal of first output line 60 to produce the second input signal on second input line 35. Similarly, second input mixer 40 mixes the first input signal with the second output signal of second output line 61 to produce the third input signal on third input line 45. The first input signal is initially passed through first input mixer 30 and second input mixer 40 to phase control circuit 50 and amplitude control circuit 70 as second input signal 35 and third input signal 45, respectively. Subsequent processing of second input signal 35 by PC circuit 50, therefore, produces first output signal 60 and second output signal 61.

Although the phase error signal is typically a randomly varying signal, in the presence of phase jitter the phase error signal can be approximated as a periodic signal. For purposes of a simplified description, the current input to canceller 10 is approximated as a periodic signal $A^*\cos(b)$ having a frequency, phase (b) and amplitude (A). The current phase of canceller 10 is (a). During steady state operation, after the circuit has fully converged, (a) and (b) are roughly equal. Thus, the phase error which is equal to a–b approaches zero.

Referring to PC circuit 50 of FIG. 2, second input signal 35 is processed as above to produce the input to sin/cos generator 59 on second delay line 58a, which is a signal representing the current phase of canceller 10 (phase value (a)). The constant 62 input to adder 56 at its fourth input, is a constant value determined based on the sampling frequency and the desired center frequency of the phase error to be cancelled. Sin/cos generator 59 receives the phase signal on second delay line 58a and processes it to produce periodic signals as first output signal 60 and second output signal 61. In the preferred embodiment, sin/cos generator 59 produces as output signals sin(a) and cos(a) on first output line 60 and second output line 61, respectively. As above, (a) is the current phase value of canceller 10. In steady state operation, the current phase (a) of canceller 10 approaches the phase (b) of the phase error signal received on main input line 15. Thus, in steady state operation, first output 60 and second output 61 mimic the phase and frequency of the phase error signal (i.e. sin(a)=sin(b) and cos(a)=cos(b)) with unity amplitude.

In operation, first input signal 25 is mixed with first output signal 60 by first input mixer 30 to produce second input signal 35. First output signal 60 is approximated by sin(a), and first input signal 25 is approximated by $A^*\cos(b)$. Thus, second input signal 35 is approximated as:

$$(A^*\cos(b))^*\sin(a) = (A/2)^*[\sin(a-b) + \sin(a+b)]. \quad (1)$$

As canceller 10 approaches convergence, (a) approaches (b), and second input signal 35 can be approximated as $(A/2)^*\sin(a-b)$, which for a small value of the phase (a–b) is proportional to the phase error, (a–b).

Similarly, first input signal 25 is mixed with second output signal 61 by second input mixer 40 to produce third input signal 45. Second output signal 61 is approximated by cos(a), and first input signal 25 is approximated by $A^*\cos(b)$. Thus, third input signal 45 is approximated as:

$$(A^*\cos(b))^*\cos(a) = (A/2)^*[\cos(a-b) + \cos(a+b)]. \quad (2)$$

As the circuit approaches convergence, (a) approaches (b), and third input signal 45 can be approximated as (A/2) since cos(a–b) is roughly equal to unity for small angles and the double frequency term can be omitted. The result is therefore proportional to the amplitude (A).

Third input signal 45 is processed by AC circuit 70 as above to produce an amplified version of third input signal 45 on AC integrator line 75a, which in the preferred embodiment is equal to (A), the amplitude of the original input phase error signal $(A^*\cos(b))$. Second AC mixer 73 mixes the signal received on integrator line 75a, having amplitude (A), with the second output signal on second output line 61.

In the steady state, as above, second output signal 61 mimics the phase and frequency of the original input phase error signal $(A^*\cos(b))$ since (a) is equal to (b) (i.e., cos(a)=cos(b)), but with unity amplitude. Thus, second AC mixer 73 imposes the proper amplitude (A) from integrator output signal 75a to produce a signal mimicking the original input phase error signal in amplitude and phase $(A^*\cos(a)=A^*\cos(b))$ on line 73a. Delay circuit introduces a delay, thereby producing output signal 95.

Figure 3:
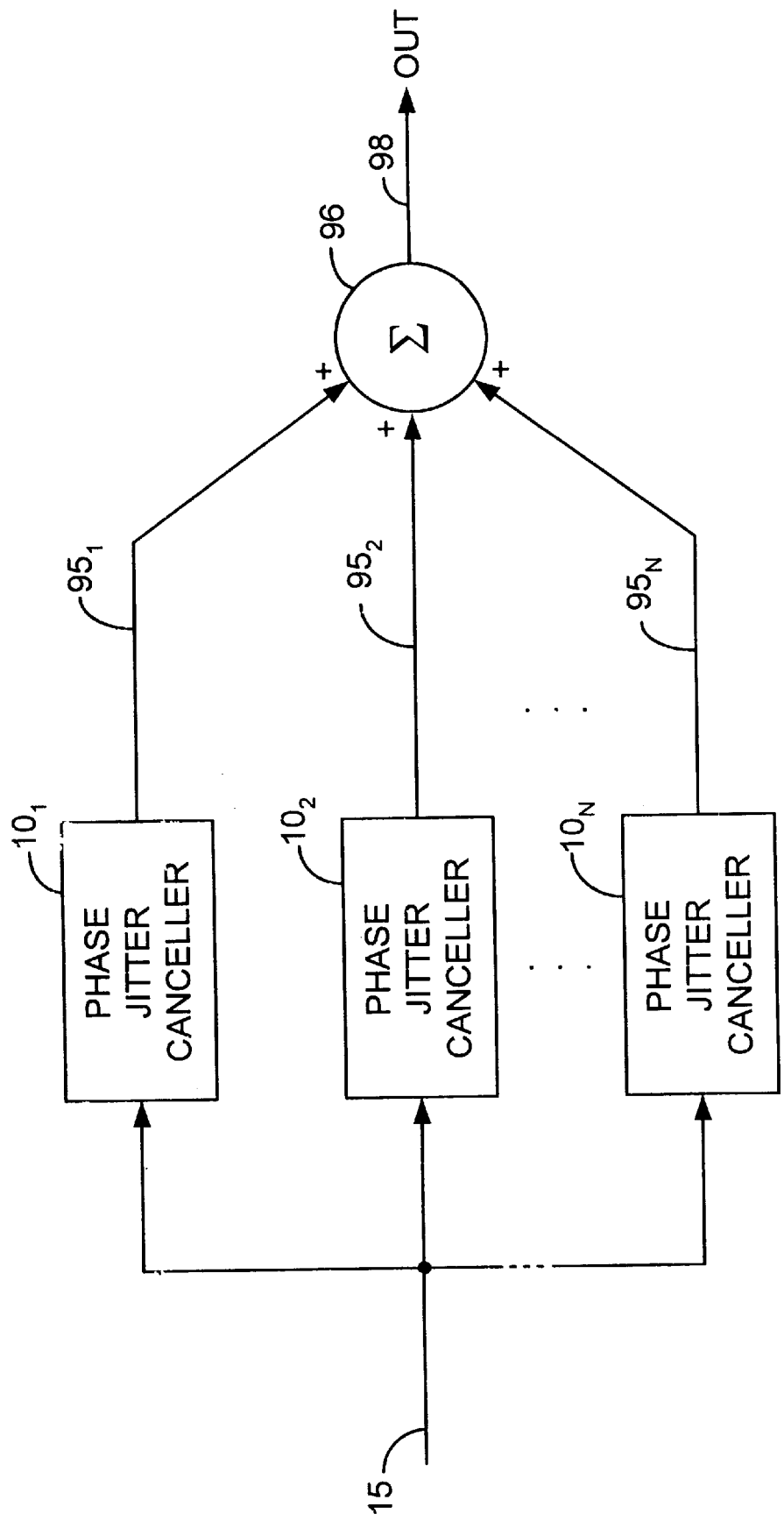
FIG. 3 is a block diagram of a parallel arrangement of phase jitter cancellers according to the present invention.

FIG. 3 is a block diagram of a parallel arrangement of phase jitter cancellers according to the present invention. As shown in FIG. 3, N different phase jitter cancellers are provided in parallel, where N is the number of components of phase jitter desired to be cancelled. For example, where it is desired to cancel 30 Hz, 60 Hz, and 120 Hz components of phase jitter N=3 phase jitter cancellers $10_1$, $10_2$, and $10_3$ are provided.

A phase error signal having one or more components of phase jitter is received on first main input line 15 by first canceller $10_1$. The tracking range of first canceller $10_1$ is adjusted by adjusting first constant $62_1$ (not shown) to provide first canceller $10_1$ with the ability to estimate a first desired specific component of phase jitter, for example, the 30 Hz component. First output signal $95_1$ is an estimate (frequency and amplitude) of the first specific component of phase jitter. In a similar manner, second canceller $10_2$ through the Nth canceller $10_N$ each receive and process the phase error signal on main input line 15 and output estimates of the second through the Nth specific components of phase jitter on output lines $95_2$ through $95_N$, respectively. Output adder 96 is provided for adding, or summing, the signals on lines $95_1$ through $95_N$, as shown, to produce a main output signal on main output line 98. Main output signal 98 is, therefore, a combination of the N specific phase jitter components.

Figure 4:
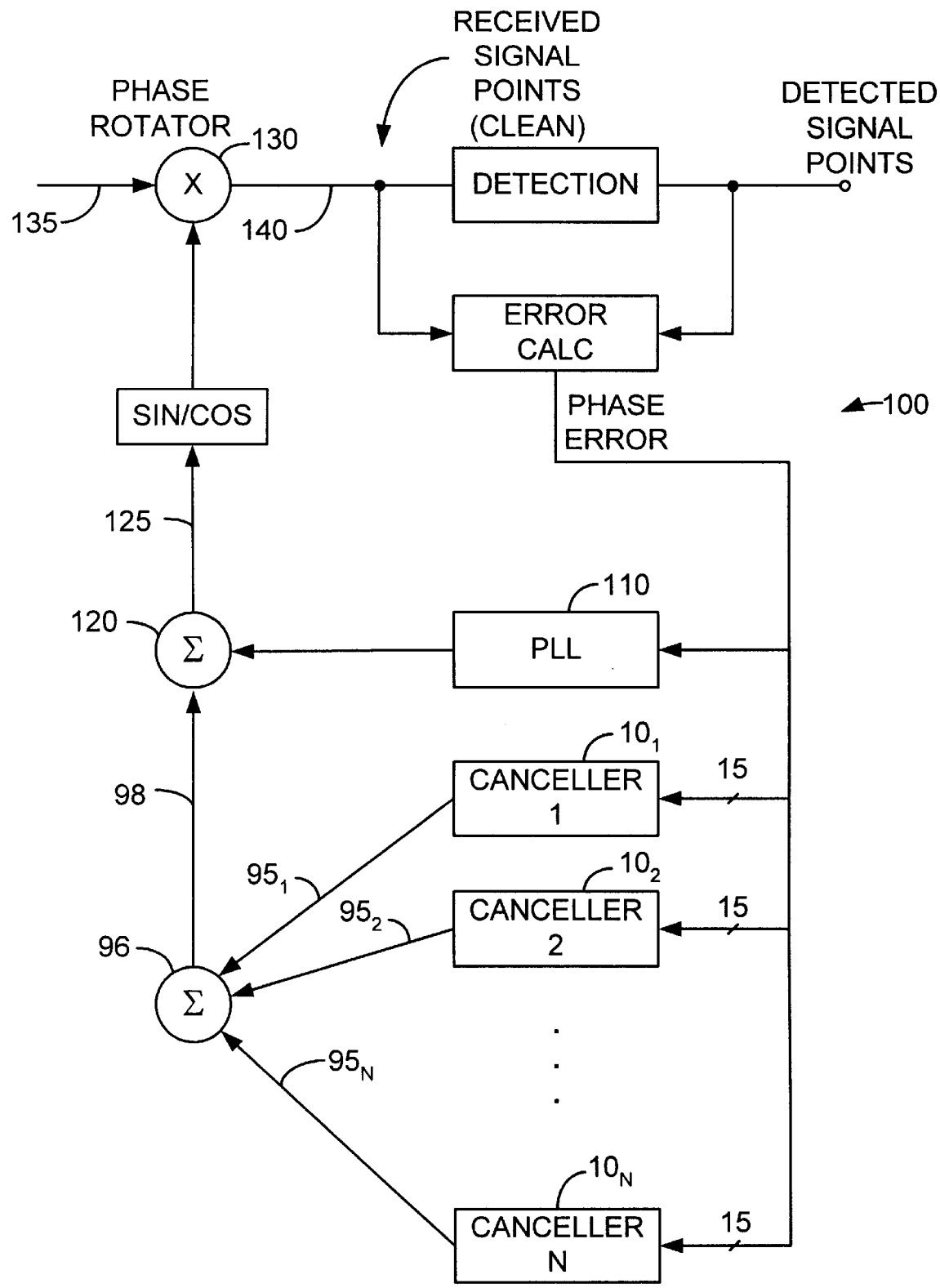
FIG. 4 is a block diagram of a detection system using a parallel arrangement of phase jitter cancellers according to the present invention.

FIG. 4 is a block diagram of a detection system 100 using a parallel arrangement of phase jitter cancellers according to the present invention. Detection system 100 is a standard modem receiver, but may be any system for receiving and detecting signals that is susceptible to phase jitter. Detection system 100 and its various system components are well known in the art. Output 98, as above, which provides an estimate of the phase jitter components desired to be cancelled, is added to the output of PLL 110 by adder 120. The output 125 of adder 120 is input to phase rotator 130 where it is combined with incoming signal 135. Combination of the estimates of the specific components of phase jitter on line 125 with the incoming signal 135 containing the actual phase jitter components results in cancellation of the phase jitter. The rotator output 140 is, therefore, a clean version of signal 135, without the specific components of phase jitter estimated by cancellers $10_1$ to $10_N$. In steady state operation, for example, in the presence of relatively large phase jitter on incoming signal line 135, the phase error signal 15 is small, and the combined output 98 of the cancellers is relatively large. When the inputs signals 135 and 125 to phase rotator 130, which are both relatively large, are combined, the resulting output 140 is a clean signal without phase jitter.

Although the above is a complete description of the preferred embodiments of the invention, various alternatives, modifications, and equivalents may be used. Therefore, the above description should not be taken as limiting the scope of the invention which is defined by the appended claims.

What is claimed is:

1. A method of determining the phase jitter characteristics of a phase error signal having phase jitter centered around a particular frequency, the phase error signal having a first amplitude and a first phase value, the method comprising the steps of:
    a) receiving the phase error signal at an input to a circuit assembly having a first output terminal, a second output terminal and a third output terminal;
    b) mixing, using a first mixer of said circuit assembly, the phase error signal with a first output signal so as to produce a first input signal;
    c) processing said first input signal so as to produce said first output signal at said first output terminal and to produce a second output signal at said second output terminal, such that said first and second output signals are periodic functions having a second phase value, and wherein said second output signal is 90 degrees out of phase with respect to said first output signal;
    d) mixing, using a second mixer of said circuit assembly, the phase error signal with said second output signal so as to produce a second input signal having a second amplitude proportional to the first amplitude;
    e) processing said second input signal so as to produce a third output signal at said third output terminal, such that said third output signal is a function of said second phase value, and
    f) adding said third output signal to the phase error signal prior to step b.

2. The method of claim 1, wherein said processing step e) includes the steps of:
    1) processing said second input signal so as to produce an intermediate signal having an amplitude equal to the first amplitude; and
    2) mixing, using a third mixer of said circuit assembly, said intermediate signal with said second output signal so as to produce said third output signal such that said third output signal has an amplitude equal to the first amplitude.

3. The method of claim 1, wherein said circuit assembly processes signals centered around a center frequency, and wherein said processing step c) includes the step of adjusting said center frequency to the particular frequency desired to be cancelled.

4. The method of claim 1, wherein in steady state operation in said processing step c) said first input signal is processed such that said second phase value of said first and second output signals is approximately equal to the first phase value of the phase error signal, and wherein in said processing step e), said second input signal is processed such that the frequency and amplitude of said third output signal is approximately equal to the frequency and amplitude of the particular phase jitter component desired to be cancelled out.

5. A method of determining the phase jitter characteristics of a phase error signal having phase jitter centered around a particular frequency, wherein the phase error signal has a first amplitude (A) and a first phase value (b) and is approximated by $A*\cos(b)$, the method comprising the steps of:
    a) receiving the phase error signal at an input to a circuit assembly having a first output terminal, a second output terminal and a third output terminal;
    b) mixing, using a first mixer of said circuit assembly, the phase error signal with a first output signal so as to produce a first input signal;
    c) processing said first input signal so as to produce said first output signal at said first output terminal and to produce a second output signal at said second output terminal, such that said first and second output signals are periodic functions having a second phase value (a), and such that said first output signal is approximated by $\sin(a)$ and said second output signal is approximated by $\cos(a)$;
    d) mixing, using a second mixer of said circuit assembly, the phase error signal with said second output signal so as to produce a second input signal having a second amplitude proportional to the first amplitude;
    e) processing said second input signal so as to produce an intermediate signal having the first amplitude (A);
    f) mixing, using a third mixer of said circuit assembly, said intermediate signal with said second output signal so as to produce a third output signal at said third output terminal, such that said third output signal is approximated by $A*\cos(a)$; and
    g) adding said third output signal to the phase error signal prior to step b).

6. The method of claim 5, wherein said circuit assembly processes signals centered around a center frequency, and wherein said processing step c) further includes the step of adjusting said center frequency to the particular frequency desired to be cancelled.

7. The method of claim 5, wherein in steady state operation in said processing step c) said first input signal is processed such that said second phase value (a) of said first and second output signals is approximately equal to the first phase value (b) of the phase error signal, and such that said third output signal is approximately equal to $A*\cos(b)$.

* * * * *